(12) United States Patent
Parker

(10) Patent No.: US 6,205,055 B1
(45) Date of Patent: Mar. 20, 2001

(54) DYNAMIC MEMORY CELL PROGRAMMING VOLTAGE

(75) Inventor: Allan Parker, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/512,854

(22) Filed: Feb. 25, 2000

(51) Int. Cl.$^7$ ............................ G11C 16/04; G11C 16/06
(52) U.S. Cl. ............................ 365/185.19; 365/185.22; 365/185.28
(58) Field of Search ................ 365/185.19, 185.22, 365/185.28, 185.2, 185.03, 185.29

(56) References Cited

U.S. PATENT DOCUMENTS

| | | | |
|---|---|---|---|
| 5,302,870 | 4/1994 | Chern | 307/530 |
| 5,429,968 | 7/1995 | Koyama | 437/48 |
| 5,457,650 | 10/1995 | Sugiura et al. | 365/184 |
| 5,523,972 | 6/1996 | Rashid et al. | 365/185.22 |
| 5,596,526 | 1/1997 | Assar et al. | 365/185.17 |
| 5,602,789 | 2/1997 | Endoh et al. | 365/201 |
| 5,608,679 * | 3/1997 | Mi et al. | 365/201 |
| 5,689,679 | 11/1997 | Jouppi | 395/449 |
| 5,757,699 * | 5/1998 | Takeshima et al. | 365/185.24 |
| 5,784,315 * | 7/1998 | Itoh | 365/185.22 |
| 5,815,436 | 9/1998 | Tanaka et al. | 365/185.03 |
| 5,831,900 | 11/1998 | Miyamoto | 365/185.03 |
| 5,847,992 | 12/1998 | Tanaka et al. | 365/185.03 |
| 5,852,575 | 12/1998 | Sugiura et al. | 365/184 |
| 5,926,409 * | 7/1999 | Engh et al. | 365/45 |
| 5,949,101 | 9/1999 | Aritome | 257/315 |
| 5,986,929 | 11/1999 | Sugiura et al. | 365/185.03 |
| 6,011,715 * | 1/2000 | Pasotti et al. | 365/185.03 |
| 6,014,330 * | 1/2000 | Endoh et al. | 365/185.17 |
| 6,026,015 | 2/2000 | Hirakawa | 365/185.03 |
| 6,028,792 | 2/2000 | Tanaka et al. | 365/185.22 |
| 6,046,934 * | 4/2000 | Lin | 365/185.03 |

FOREIGN PATENT DOCUMENTS

WO 99/07000    2/1999   (WO).

* cited by examiner

*Primary Examiner*—Son Mai
(74) *Attorney, Agent, or Firm*—Brinks, Hofer, Gilson & Lione

(57) ABSTRACT

A method of programming a memory cell comprises erasing, programming, and determining the pulse count for one or more memory cells. The memory cell(s) is erased. Then, the memory cell is programmed with a first programming voltage. A first pulse count is determined. The first pulse count indicates the number of programming pulses used to program the memory cell with the first programming voltage. The first pulse count is compared with a target pulse count. The programming voltage is stored if the first pulse count compares with the target pulse count. If the first pulse count fails to compare with the target pulse count, the memory cell(s) is programmed with a second programming voltage and the process is repeated until the pulse count compares with the target pulse count.

22 Claims, 2 Drawing Sheets

DYNAMIC MEMORY CELL PROGRAMMING VOLTAGE

BACKGROUND

A flash memory cell can be a field effect transistor (FET) that includes a select gate, a floating gate, a drain, and a source. A cell can be read by grounding the source, and applying a voltage to a bitline connected with the drain. By applying a voltage to the wordline connected to the select gate, the cell can be switched on and off.

Programming a cell includes trapping excess electrons in the floating gate to increase voltage. This reduces the current conducted by the memory cell when the select voltage is applied to the select gate. The flash cell is programmed when the cell current is less than a reference current when the select voltage is applied. The cell is erased when the cell current is greater than the reference current and the select voltage is applied.

BRIEF SUMMARY OF THE PREFERRED EMBODIMENTS

A method of programming a memory cell comprises erasing, programming, and determining the pulse count for one or more memory cells. The memory cell(s) is erased. Then, the memory cell is programmed with a first programming voltage. A first pulse count is determined. The first pulse count indicates the number of programming pulses used to program the memory cell with the first programming voltage. The first pulse count is compared with a target pulse count. The programming voltage is stored if the first pulse count compares with the target pulse count. If the first pulse count fails to compare with the target pulse count, the memory cell(s) is programmed with a second programming voltage and the process is repeated until the pulse count compares with the target pulse count.

BRIEF DESCRIPTION OF SEVERAL VIEWS OF THE DRAWINGS

The present invention is illustrated by way of example and not limitation in the accompanying figures. In the figures, like reference numbers indicate identical or functionally similar elements. Additionally, the left-most digit(s) of a reference number identifies the figure in which the reference number first appears.

DETAILED DESCRIPTION OF THE PREFERRED EMBODIMENTS

A memory device commonly includes several memory chips that each have one or more memory cells. The memory chips may be from the same semiconductor wafer or from different wafers. Chips, within the same semiconductor wafer or from different wafers, can have varying physical characteristics. One of the characteristics that may vary from chip to chip (cell to cell) is programming characteristic. A memory cell can be programmed by applying a variety of pulses to the cell. Traditionally, each pulse had the same pulse width and the same pulse height (programming voltage) and each cell was programmed with the same number of pulses. As the voltage increases, the number of required pulses is decreased.

Figure 1:
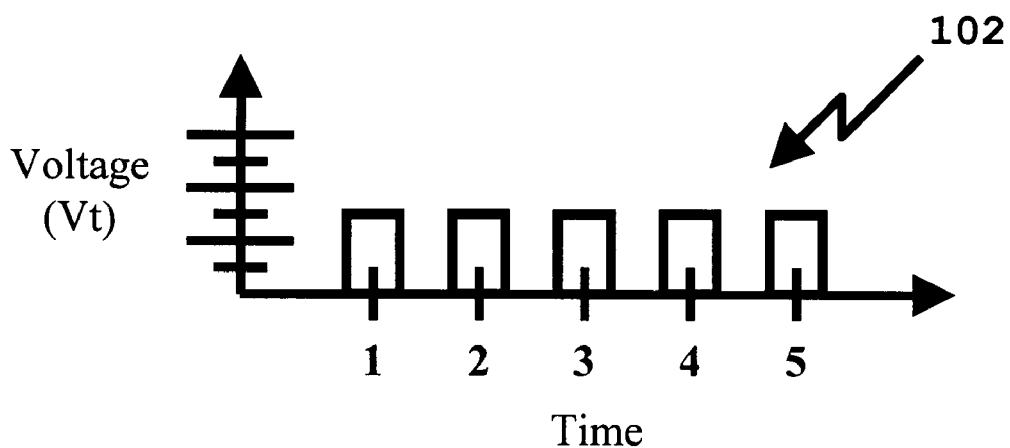
FIG. 1 is a representation of five programming pulses.
Figure 2:
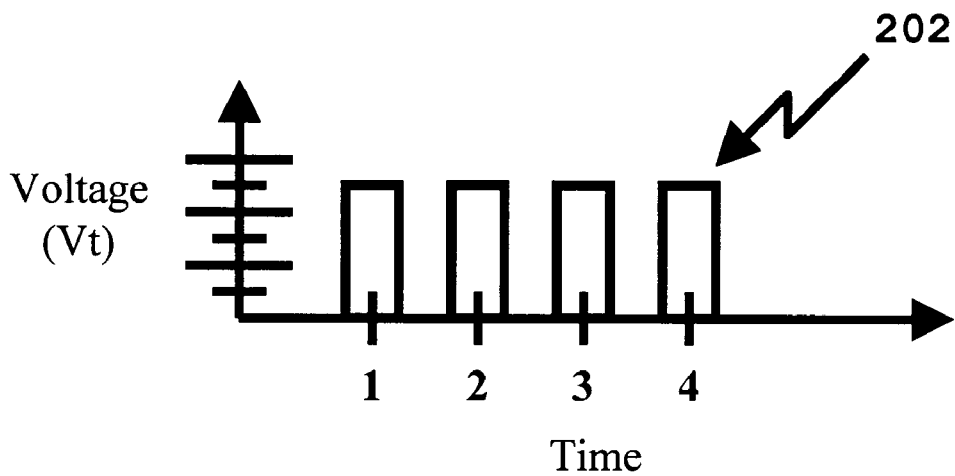
FIG. 2 is a representation of four programming pulses.

FIG. 1 is a representation of five programming pulses and FIG. 2 is a representation of four programming pulses. The pulse width of the pulses in FIG. 1 and FIG. 2 are identical, however, the pulse height (programming voltage level) and the number of pulses are different. FIG. 2 has fewer pulses and the program voltage is higher then the pulses in FIG. 1. A memory cell can be programmed with the pluses in FIG. 2 in 80% of the time of a memory cell programmed with the pluses in FIG. 1. This time saving may be used to decrease the overall programming time. Or preferably, various programming voltages are used for each memory cell so that all memory cells are programmed in the same length of time. Slower memory cells are programmed at a higher programming voltage so that their programming time is substantially the same as the fastest memory chip or cell. This is a superior solution to the conventional means of reducing the programming speed of the faster memory cells to match the programming speed of the slower memory cells while maintaining identical pulse count, pulse width, and pulse height for both the faster and slower memory cells.

Figure 3:
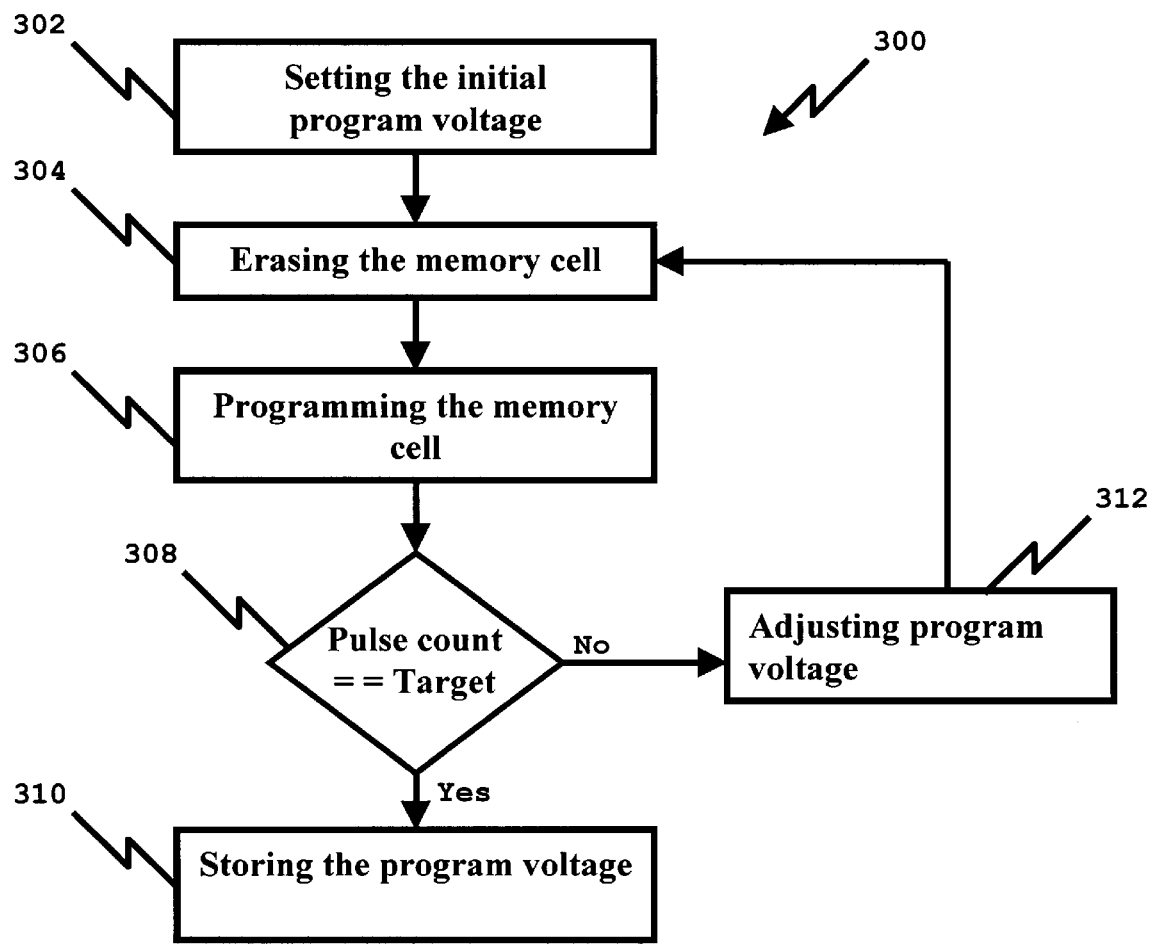
FIG. 3 is a flow diagram of an embodiment of a method for adjusting the programming voltage of a memory cell.

FIG. 3 is a flow diagram of an embodiment of a method 300 for adjusting the programming of a memory cell. The method 300 includes setting an initial program voltage 302, erasing the cell 304, programming the wordline 306, comparing the pulse count to a target pulse count 308. If the pulse count does not meet the target pulse count then adjusting the program voltage 312 and repeating 304, 306, and 308. If the pulse count does meet the target pulse count, storing the last program voltage 310. The target pulse count can be a fixed number, such as 16, a range of numbers, such as 15 to 18 or greater than 15 or less than 18. The pulse count compares with the target pulse count when the pulse count equals a fixed number target pulse count or is within the range of a range target pulse count. The pulse count fails to compare with the target pulse count when the pulse count does not equal a fixed number target pulse count, or is not within the range of a range target pulse count.

The method 300 can be performed at anytime. It is preferred that the method 300 is performed during the initial sort of the memory dies (chips). Additionally, over time the programming characteristics of the memory may vary. Thus, periodically performing the method 300 is also desirable.

An initial program voltage is set 302 the first time the method 300 is run on the memory chip or cell. The initial program voltage can be set to any reasonable value, including a maximum, minimum, or optimal programming voltage for the memory cell. The memory cell is then erased 302 by applying an erase level voltage to the wordline. The erase voltage can be the same erase voltage applied before normal programming of the memory cell. The memory cell is then programmed 306 by applying the current program voltage to the wordline. During the programming of the memory cell 306, the signal line is monitored to determine when the memory cell has been programmed. The number of pulses ("pulse count") used to program the memory cell is kept for later use. In 308, the pulse count required to program the memory cell is compared to a target number of pulse counts. If the pulse count is less than the target then the program voltage is decreased 312 and the process is repeated. If the pulse count is greater than the target then the program voltage is increased 312 and the process is repeated. If the pulse count is equal to the target then the program voltage is stored 310 and the process is complete. The target pulse count can be a single number, for example 16 or it can be a range, for example 14–17. It is preferred that the pulse count be a whole number or a range of whole numbers. Alternatively, the pulse count can be a factional number, such as 16.5 that indicates 16 pulses at the full programming voltage and one pulse at half the full programming voltage.

In a first preferred embodiment, in 302 the initial program voltage is set to a maximum programming voltage, for example approximately 19 volts. In 304, the memory cell is erased. The memory cell is programmed 306 while the signal line is monitored until it indicates that the cell has been programmed. In 308, the pulse count is compared to a target pulse count. The target pulse count can be approximately ten. In 308, if the pulse count does not compare to the target pulse count, then the program voltage is adjusted in 312, else the program voltage is stored in 310. The adjusting of the program voltage includes decreasing the program voltage in increments of 0.5 volts. In 310, the writing of the program voltage includes storing an indicator of the voltage, for example in an internal register associated with the memory cell.

In a second preferred embodiment, in 302 the initial program voltage is set to a minimum programming voltage, for example approximately 10 volts.

In a third preferred embodiment, in 302 the initial program voltage is set to an estimated programming voltage, for example approximately 15 volts. The estimated programming voltage is preferably the manufacture's specified programming voltage or a statistically determined number. The estimated programming voltage can be determined based on prior memory cell programming or other methods.

The method of FIG. 3 can be applied to an array, a group, a bank, or a page of memory cells. In a preferred embodiment, each memory cell in the array of memory cells have the same target pulse count.

A group of cells may be tested together and a single programming voltage is determined for all the memory cells in the group with a single target pulse count.

Figure 4:
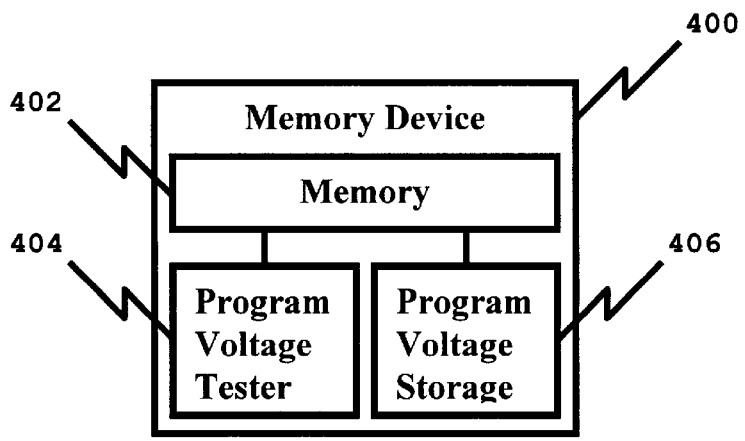
FIG. 4 is a representation of a memory device with a memory cell, a voltage tester, and a pulse count memory.

FIG. 4 is a representation of a memory device 400 with memory 402, a program voltage tester 404, and program voltage storage 406. The program voltage tester 404 performs the program voltage testing, for an example of such as the method of FIG. 3. Optionally, the program voltage tester 404 can be capable of executing multiple different program voltage tests. The program voltage storage 406 stores the output of the program voltage test. Optionally, the program voltage storage 406 can store the initial program voltage in a preferred embodiment.

The program voltage tester 404, also called a voltage means can include a programming voltage means for adjusting the programming voltage and a pulse count means for comparing the pulse count to a target pulse count.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A method of programming a memory cell, comprising:
    erasing the memory cell;
    programming the memory cell with a first programming voltage;
    determining a first pulse count that indicates a number of programming pulses used to program the memory cell with the first programming voltage;
    comparing the first pulse count to a target pulse count;
    storing a programming voltage if the first pulse count compares with the target pulse count;
    programming the memory cell with a second programming voltage and determining a second pulse count if the first pulse count fails to compare with the target pulse count.

2. The method of claim 1 wherein said steps are performed during an initial sort of the memory cells, the stored programming voltage thereafter being used during programming of the memory cell.

3. The method of claim 2 wherein the target pulse count is a whole number.

4. The method of claim 2 wherein the target pulse count is a range of whole numbers.

5. The method of claim 4 wherein the target pulse count is 14 to 16.

6. The method of claim 4 wherein the target pulse count is greater than 14.

7. The method of claim 4 wherein the target pulse count is less than 16.

8. The method of claim 2 wherein the first program voltage is a maximum programming voltage.

9. The method of claim 2 wherein the first program voltage is a minimum programming voltage.

10. The method of claim 2 wherein the first program voltage is an optimal programming voltage.

11. The method of claim 2 wherein the first pulse count is greater than the target pulse count and the second programming voltage is greater than the first programming voltage.

12. The method of claim 2 wherein the first pulse count is less than target pulse count and the second programming voltage is less than the first programming voltage.

13. The method of claim 2 wherein the method is applied to an array of memory cells using the same target pulse count.

14. The method of claim 13 wherein a single programming voltage is used for each memory cell.

15. A memory device, comprising:
    (a) a memory cell;
    (b) a program voltage tester connectable with the memory cell, the program voltage tester being capable of testing the memory cell to determine a programming voltage that programs the memory cell with a target pulse count; and
    (c) a program voltage storage connectable with the program voltage tester, the program voltage storage being capable of storing an indicator of the program voltage, the indicator thereafter determining the program voltage when programming the memory cell.

16. The memory device of claim 15 wherein the program voltage storage is integrated with the memory cell.

17. The memory device of claim 15 wherein the program voltage tester is integrated with the memory cell.

18. The memory device of claim 15 wherein the program voltage tester comprises a pulse count tester and a program voltage adjuster, the pulse count tester being capable of comparing a number of pulses used to program the memory cell with the target pulse count and the program voltage adjuster being capable of adjusting the programming voltage.

19. The memory device of claim 15 wherein the program voltage tester is capable of repeatedly testing the memory with incrementally higher programming voltage level until the pulse count compares with the target pulse count.

20. The memory device of claim 15 wherein the program voltage tester is capable of repeatedly testing the memory with incrementally lower programming voltage level until the pulse count comprises with the target pulse count.

21. A memory device, comprising:
 (a) a plurality of memory cells;
 (b) a voltage means for determining programming voltages that program each memory cell with a target pulse count;
 (c) a storage means for storing the programming voltages for each memory cell, the storage means thereafter determining the programming voltages when programming the memory cell.

22. The memory device of claim 21, wherein voltage means includes a pulse count determination means for determining a pulse count and a program voltage means for incrementally adjusting the programming voltage.

* * * * *